(12) United States Patent
Tabacutu

(10) Patent No.: US 6,617,522 B2
(45) Date of Patent: Sep. 9, 2003

(54) CONNECTOR APPARATUS, AND ASSOCIATED METHOD, FORMED OF MATERIAL EXHIBITING PHYSICAL-MEMORY CHARACTERISTICS

(75) Inventor: Cristian Tabacutu, New Westminster (CA)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/870,039

(22) Filed: May 30, 2001

(65) Prior Publication Data

US 2002/0179326 A1 Dec. 5, 2002

(Under 37 CFR 1.47)

(51) Int. Cl.[7] ................................................ H05K 1/16
(52) U.S. Cl. ................. 174/260; 174/262; 174/261; 174/266; 361/760; 361/769; 361/773; 361/801; 361/807; 439/161
(58) Field of Search ................................ 174/260, 262, 174/266, 261, 258, 267; 439/161, 84; 361/760, 769, 772, 773, 801, 802, 807, 809; 257/774

(56) References Cited

U.S. PATENT DOCUMENTS

| | | | | |
|---|---|---|---|---|
| 3,524,108 A | * | 8/1970 | English | 361/773 |
| 4,541,034 A | * | 9/1985 | Fanning | 361/773 |
| 4,746,300 A | * | 5/1988 | Thevenin | 439/82 |
| 5,059,133 A | * | 10/1991 | Hikami et al. | 439/161 |
| 5,120,257 A | * | 6/1992 | Hahn | 439/567 |
| 5,366,381 A | * | 11/1994 | Kile | 439/79 |
| 5,726,862 A | * | 3/1998 | Huynh et al. | 361/773 |
| 5,731,958 A | * | 3/1998 | Kozel | 361/743 |
| 6,222,136 B1 | * | 4/2001 | Appelt et al. | 174/254 |
| 6,280,248 B1 | * | 8/2001 | Mitra | 439/571 |

FOREIGN PATENT DOCUMENTS

JP  4-132250  5/1992

* cited by examiner

Primary Examiner—Kamand Cuneo
Assistant Examiner—I B Patel
(74) Attorney, Agent, or Firm—Milan I. Patel

(57) ABSTRACT

A connector, and an associated method, for connecting an electrical circuit component to a substrate, such as a printed circuit board. The connector is formed of one of more pin members formed of an electrically-conductive material which exhibits physical-memory characteristics. The pin member is initially configured into a memory configuration and thereafter reconfigured into an alternate reconfiguration. The alternate configuration is selected to facilitate mounting of the circuit component upon the substrate. Thereafter, the pin member is heated to beyond a deformation threshold temperature. When at such temperature, the pin member becomes reconfigured into the memory configuration. Through appropriate selection of the memory configuration, heating of the pin member causes connection of the circuit component with the substrate.

10 Claims, 1 Drawing Sheet

CONNECTOR APPARATUS, AND ASSOCIATED METHOD, FORMED OF MATERIAL EXHIBITING PHYSICAL-MEMORY CHARACTERISTICS

FIELD OF THE INVENTION

The present invention relates generally to a manner by which to connect an electrical circuit component, such as integrated circuit (IC) package, to a substrate, such as a printed circuit board. More particularly, the present invention relates to a connector, and an associated method, for forming a connection between the circuit component and the substrate. The connector is formed of a metallic material which exhibits physical-memory characteristics. A solderless connection is formed, and, therefore, environmental concerns associated with the use of conventional, lead-base solder materials are obviated.

BACKGROUND OF THE INVENTION

Advancements in the field of electronic component technologies have permitted the introduction and commercialization of an ever-increasing array of circuits formed of electronic components. Such advancements in electronic component technologies permit, amongst other things, miniaturization of electronic components.

Electronic components include integrated circuits which are typically formed of large numbers of integrated-circuit elements. The integrated-circuit elements are packaged into a single, integrated-circuit package. Integrated-circuit packages, as well as discrete circuit components, are often times mounted to, or otherwise formed in, printed circuit boards, and the resultant assembly forms the electronic circuitry of an electronic device formed therefrom.

The printed circuit board at which the components are mounted, or otherwise formed, typically include conductive traces for electrically interconnecting the components mounted to the circuit board. Conductive, solder material typically forms the conductive traces formed on the printed circuit board. And, the solder material also electrically connects, and affixes, the electronic components mounted to the circuit board.

During assembly of the electronic circuitry, a substrate is first configured to form the printed circuit board. Typically, trace lines are defined upon the surfaces of the substrates, and through holes are formed in the substrate at which connectors of the IC packages and other discrete components are to be positioned during assembly of the electronic circuitry. Once the substrate have been prepared to formed the printed circuit board the IC packages and other discrete components are mounted in position upon the printed circuit board. Thereafter, the components mounted upon the printed circuit board are electrically connected theretogether and affixed in position at the printed circuit board.

Typically, solder connections are formed to connect the components mounted upon the printed circuit board in position thereat as well as sometimes also to form the conductive traces extending along the printed circuit board, thereby to electrically connect different ones of the components theretogether. The solder connections further affix the various components in their respective mounted positions at the printed circuit board.

When the electronic circuitry is mass-assembled in an automated assembly process, the substrates are first prepared, or purchased already-prepared, to form the printed circuit boards. And, the IC packages and other discrete components are mounted upon the printed circuit board using automated machinery. Typically, the solder connections are formed utilizing solder bath techniques in which at least portions of the printed circuit boards, together with the components mounted thereon, are immersed into a pool of heated, and liquefied, solder material. The pool, sometimes referred to as a solder bath, coats portions of the printed circuit board, and the connector leads of the components mounted thereon are coated with electrically-conductive solder material. The printed circuit board is removed out of the solder bath, and the solder solidifies as the solder material cools. Once cooled, the components mounted upon the circuit board are electrically connected theretogether and affixed in position at the printed circuit board.

Conventional solder materials are typically lead (Pb)-based. That is to say, the solder material typically is formed of an alloy including lead. Various environmental and health concerns have been raised regarding lead and the use of lead-based solder materials. While other types of solder materials are available, such alternatives exhibit other disadvantages which limit their usefulness. For instance, silver (Ag)-based solder materials are available. However, the material costs associated with silver-based solder material make its use impractical when cost-minimization is a design goal.

An alternate manner by which to connect an electronic circuit component to a printed circuit board, or other substrate, would therefore be advantages.

It is in light of this background information related to electronic component technologies that the significant improvements of the present invention have evolved.

SUMMARY OF THE INVENTION

The present invention, accordingly, advantageously provides apparatus, and an associated method, by which to connect an electrical circuit component, such as an integrated circuit package, to a substrate, such as a printed circuit board.

Through operation of an embodiment of the present invention, a manner is provided for forming a solderless connection for connecting the electrical circuit component to the substrate. Because a solderless connection is formed, environmental concerns associated with the use of lead-based solder material are obviated.

In one aspect of the present invention, a connector is provided for an electrical circuit component, such as an integrated circuit package or a discrete electrical circuit component which is to be mounted at a printed circuit board and form a portion of electronic circuitry. The connector is integrally formed with the integrated circuit package, or other discrete component, and is formed of a pin member in a first configuration to permit insertion thereof into a through hole, or another indent, formed in the substrate. The pin member is formed of a material which exhibits physical-memory characteristics. That is to say, the material of which the pin member is formed is moldable into a first configuration. Application of, e.g., tension and torsion, forces to the connector causes reconfiguring of the pin member into a second configuration. The second configuration is selected, and the external forces are applied to effectuate reshaping of the pin member into the second configuration, such that the pin member engages with a through hole, or other indent, formed into the substrate when the electrical circuit component is mounted thereat.

Subsequent to mounting of the electrical circuit component at the substrate heat energy is applied to the pin member, such as by placing the electronic circuitry, viz., the substrate together with the components mounted thereon, into an oven. When positioned in the oven, and heat energy is generated to elevate the temperature level of the pin member beyond a selected, elevated level, the pin member is reconfigured back into the first configuration. Through appropriate selection of the first configuration into which the pin member is shaped, the pin member can be caused to become affixed to the substrate. Subsequent removal of the electronic circuitry out of the oven, or otherwise permitting cooling of the pin member does not result in a change in configuration of the pin member out of the first configuration. Connection is thereby effectuated to affix in position the electrical circuit component of which the pin members forms a portion in position at the substrate without the use of a solder material.

In another aspect of the present invention, a plurality of pin members are provided. The plurality includes a first and at least a second pin member affixed to an electrical circuit component to form a portion thereof. The first and second pin members are positioned to extend beneath opposing side portions of the circuit component. When the circuit component is mounted at the substrate, each of the pin members is positioned to extend into a through holes or other indents formed in the substrate. When the pin members are heated to be of temperature levels greater than the threshold temperature level, the pin members are reconfigured into their first configurations which cause affixation of the circuit component to the substrate. By positioning the first and second pin members at opposing side portions of the circuit component, the pin members exert clutching forces which clutchingly engage with the substrates. Appropriate positioning of the pin members and selection of the configurations of the pin members in which they are initially shaped causes the clutching forces to be generated in the opposite directions, thereby to facilitate the clutching affixation of the circuit component with the substrate.

In yet another aspect of the present invention, the pin member is first shaped into an elongated camber-leg shaped configuration having a foot pad member positioned at a distal in side thereof. Such a configuration forms the initial configuration of the pin member. The pin member is reshaped into a second configuration which exhibits a lessen amount of camber, the specific shape of which is selected to facilitate insertion of the pin member to extend in to, or through, a through-hole, or other indent, when the electrical circuit component in mounted upon a substrate. When the temperature level of the pin member is elevated beyond the threshold temperature, the pin member is reconfigured into the configuration which exhibits the greater amount of camber. The amount of camber is selected to connect the pin member, and the circuit component affixed therewith to the substrate.

In these and other aspects, therefore, apparatus, and an associated method, is provided for an electronic circuit component positionable upon a substrate and electrically connectable thereto. Connection of the electrical circuit component to the substrate is facilitated. At least a first pin member is affixed to the electrical circuit component to form a portion thereof. The first pin member is affixed to extend downwardly beneath a bottom surface of the electronic circuit component, thereby to engage with the substrate when the electronic circuit component is seated upon the substrate. The first pin member is of a first configuration when at a first temperature and is of a second configuration when heated to at least a second temperature. The first pin member remains in the second configuration subsequent to heating thereof, to at least second temperature. The second configuration into to which the first pin member is configurable facilitates maintenance of connection of the electronic circuit component upon the substrate.

A more complete appreciation of the present invention and the scope thereof can be obtained accompanying drawings which are briefly summarized below, the following detailed description of the presently-preferred embodiment of the invention, and the appended claims.

DETAILED DESCRIPTION

Figure 1:
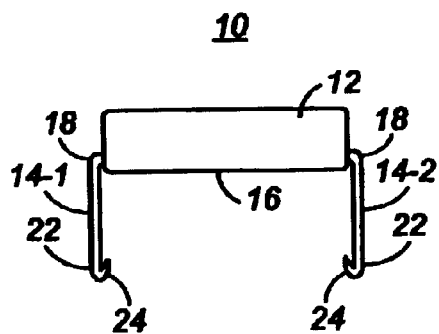
FIG. 1 illustrates a partial functional block, partial side-elevational view of an electrical circuit component which includes the connector of an embodiment of the present invention when configured in a first selected configuration.

Referring first to FIG. 1, an electrical circuit component, shown generally at 10, is exemplary of a circuit component mountable upon a printed circuit board, or other substrate to form a portion of a electronic circuitry of any of many conventional, and other, electronic devices. In the exemplary implementation shown in the figure, the circuit component 10 forms an integrated circuit package 12 having an integrated circuit package within a protective housing structure. The circuit component, however, is representative of any of many various types of certain components mountable at a printed circuit board, or other substrate including, for instance, discrete circuit components.

While the following description shall describe the electrical circuit component with respect to its exemplary construction shown in the figure, it should be understood that the following description is similarly applicable to any of many other types of devices mountable upon a substrate to be affixed thereto.

The electrical circuit component includes a plurality of pin members 14 formed to extend beneath a bottom surface 16 of the integrated circuit package 12. Two pin members, pin members 14-1 and 14-2, are shown in the figure. An integrated circuit device typically includes additional pin members formed at each of the sides of the integrated circuit package, and such additional pin members are hidden from view in the figure.

Here, each of the pin members is shaped to form an elongated leg, having a proximal side portion 18 affixed to the integrated circuit package to be integral therewith. And, each elongated leg defines a distal side portion 22. In the exemplary implementation shown in the figure, the distal side portions include back-angled foot members 24. In other implementations the distal side portions are, instead, tapered or otherwise do not include the back-angled foot members.

In the configuration shown in the figure, the foot members 14 extend substantially along longitudinal axes, and exhibit a slight, or no camber. The pin members are configured in shape to permit their insertions into indents, or through holes, in a substrate to which the circuit component is to be affixed.

The pin members are formed of an electrically-conductive material which exhibits physical-memory characteristics. That is to say, when the material is initially configured into a first configuration and thereafter reshaped, or otherwise reconfigured into a subsequent configuration, a second configuration. Upon heating of the material beyond a deformation threshold temperature, the material becomes reconfigured back into the initial configuration. The configuration of the pin members shown in FIG. 1 is here representative of the second configuration into which the pin members are configured.

FIG. 2 again illustrates the electrical circuit component formed of an integrated circuit package 12 and the pin member 14, of which the pin members 14-1 and 14-2 are viewable in the view of the figure. Here, the circuit component is shown in position in which the circuit component is mounted at a substrate having indents 32 corresponding in number and position to the pin members 14. For purposes of explanation, the indents are enlarged in diameter to appear somewhat greater in diameter in an actual implementation. A seating surface 34 is defined upon a top-face surface of the substrate. The bottom face surface 16 of the integrated circuit package 12 is positioned upon the seating surface when mounted upon the substrate.

Figure 2:
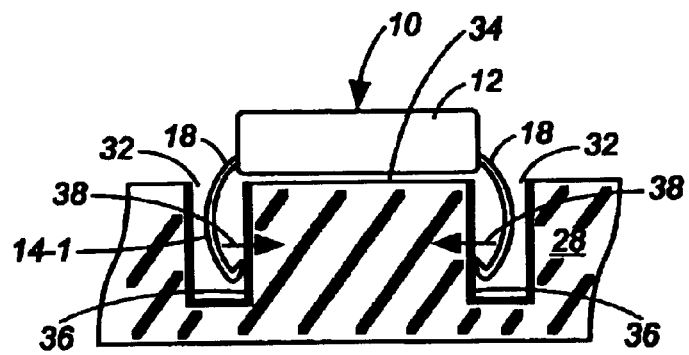
FIG. 2 illustrates a partial functional block, partial side-elevational view of the electrical circuit component having the connector of an embodiment of the present invention, here configured in another configuration.

Here, the pin members are configured in a configuration different to the configuration of the pin members shown in FIG. 1. The pin members here exhibit cambers exhibited by the pin members in the configuration shown in FIG. 1. The configuration of the pin members shown in FIG. 2 is the memory configuration, that is, the configuration in which the pin members are initially configured, and the configuration to which the pin members revert upon application of heat energy thereto to elevate the temperature of the pin members beyond a deformation threshold.

Here, the memory configuration is selected such that the pin members exhibit camber of levels great enough such that the distal end portions 22 abut against walls 36 which define the indents 32. Through appropriate selection of the amount of camber exhibited by the pin members, clutching forces generated in the directions indicated by the arrows 38 are generated to cause flexing engagement against the walls 36. When the walls 36 are painted, or otherwise formed with, conductive tracelines, the pin members, and the circuitry of the integrated circuit package becomes electrically connected thereto. Both electrical connection and physical connection is maintained thereby.

The pin members 14 of the circuit component are initially configured into the memory configuration prior to assembly of the electronic circuitry of which the electronic circuit component is to form a portion. Then, the pin members are reconfigured into the subsequent configuration. Subsequent configuration is selected to facilitate mounting of the circuit component at a substrate of the electronic circuitry during assembly thereof.

Assembly operations are performed to mount the circuit component in position upon the substrate of the electronic circuitry. When, for instance, the assembly of the circuit component upon the substrate is performed pursuant to, for example, an automated process. Once the circuit components are mounted in position, the assembly is heated in an oven to elevate the temperature levels of the pin members to at least the deformation threshold temperature. Upon reaching the deformation threshold temperature, the pin members become reconfigured into the memory configuration. As illustrated with respect to the configuration of the pin members 14 in FIGS. 1 and 2, upon deformation of the pin members into the memory configuration, the electrical circuit component becomes mechanically and electrically connected to the substrate. Because the connection is formed without the use of solder materials, environmental concerns associated with the use of lead-based solder materials are obviated.

Figure 3:
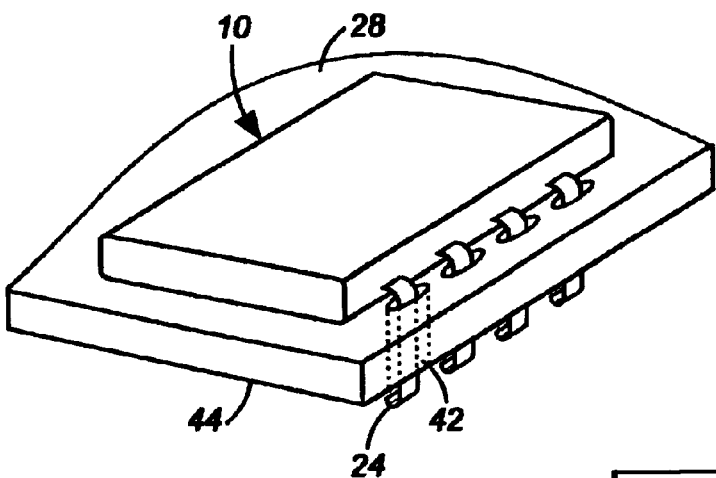
FIG. 3 illustrates a partial functional block, partial perspective view of the electrical circuit component which includes the connectors of an embodiment of the present invention subsequent to mounting of the circuit component upon a substrate and affixed in position thereat.

FIG. 3 again illustrates the electrical circuit component 10 mounted at the substrate 28. Here, the indent formed into the surface of the substrate extend entirely therethrough to define through-holes 42. Here, the pin members extend entirely through the through-holes such that back-angled foot members 24 are positioned beneath a bottom face surface 44 of the substrate. The memory configuration of the pin members are selected such that the pin members abut against the bottom face surface 44 of the substrate when the pin members are configured into the memory configuration. Thereby, the circuit component becomes connected and affixed to the substrate.

Figure 4:
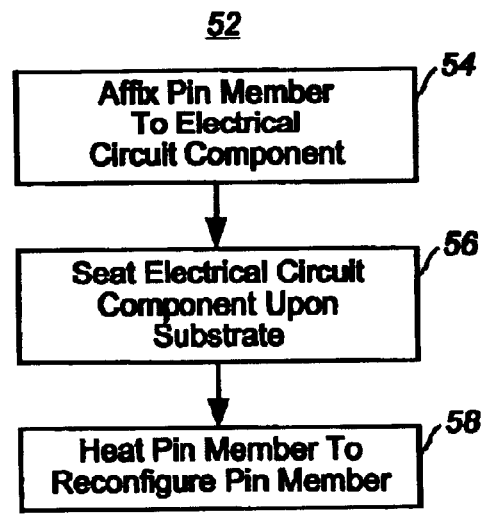
FIG. 4 illustrates a method flow diagram listing the method of operation of the method of an embodiment of the present invention.

FIG. 4 illustrates a method flow diagram, shown generally at 52 illustrating the method by which to connect an electrical circuit component to a substrate pursuant to an embodiment of the present invention.

First, and as indicated by the block 54, at least a first pin member is affixed to the electrical circuit component to extent downwardly beneath a bottom surface of the electrical circuit component. The at least first pin member is of a first configuration when at a first temperature and is of a second configuration when heated to at least a second temperature.

Then, and as indicated by the block 56, the electrical circuit component is seated upon the substrate when the at least the first pin member is configured in the first configuration.

And, and as indicated by the block 58, the pin member is heated to elevate the temperature thereof to at least a second temperature. Thereby, the pin member is reconfigured into the second configuration such that, once configured into the second configuration, the electrical circuit component becomes affixed t the substrate.

Thereby, a manner is provided by which to form a solderless connection by which to connect an electrical circuit component to a substrate.

The previous descriptions are of preferred examples for implementing the invention, and the scope of the invention should not necessarily be limited by this description. The scope of the present invention is defined by the following claims.

What is claimed:

1. In an electronic circuit component mounted upon a substrate and electronically connected thereto, the substrate defining a seating surface at which the electronic circuit is received in seating engagement thereon, the seating surface having at least a first indent coated with an electrically conductive material, an improvement of a connector for electrically connecting the electronic circuit component in affixed engagement with the substrate, said connector comprising:

at least a first pin member affixed to the electrical circuit component to form a portion thereof, said first pin member of an electrically-conductive material that exhibits physical-memory characteristics, said first pin member positioned at least alternately in a first configuration and a memory configuration, said first pin member extending into the first indent when the electronic circuit is seated upon the seating surface and said first pin member is molded in the first configuration, said first pin member reconfigured in the memory configuration responsive to heating to a deformation threshold temperature such that, when positioned in the memory configuration, first clutching forces exerted by said first pin member cause flexing engagement of said first pin member with the electrically conductive material coating the first indent.

2. In the electronic circuit component of claim 1, the at least the first indent comprises the first indent and at least a second indent and wherein said connector further comprises at least a second pin member, said first pin member extending into the first indent and said second pin member extending into the second indent when the electronic circuit component is seated at the seating surface.

3. In the electronic circuit component of claim 2, said second pin member is also positioned at least alternately in the first configuration and the memory configuration, said second pin member molded in the first configuration when the electronic circuit is seated upon the seating surface, said second pin member reconfigured into the memory configuration responsive to heating to a deformation threshold temperature such that, when positioned in the memory configuration second clutching forces exerted by said second pin member cause flexing engagement of said second pin member with electrically conductive material coating the second indent.

4. In the electronic circuit component of claim 3, said first pin member is affixed to extend beneath a first side edge of the electronic circuit component, wherein said second pin member is affixed to extend beneath a second said edge of the electronic circuit component, and wherein the first clutching force and the second clutching force are exerted in opposing directions.

5. In the electronic circuit component of claim 1, said first pin member comprises an elongated camber-leg which exhibits a cambered-configuration when configured in the memory configuration.

6. In the electronic circuit component of claim 5, the elongated camber-leg forming said first pin member exhibits an amount of camber when configured in the memory configuration greater than when the elongated camber-leg forming said first pin member is configured in the first configuration.

7. In the electronic circuit component of claim 1, the at least the first indent formed in the substrate is defined by a first through hole formed to extend therethrough and wherein said first pin member extends through the first through hole when the electronic circuit component is seated at the seating surface.

8. In the electronic circuit of claim 7, said first pin member defines a proximal side portion affixed to the electronic circuit component and a distal side portion extending beyond the substrate when the electronic circuit component is seated upon the substrate.

9. In the electronic circuit component of claim 8, said first pin member further comprises a foot piece positionable to abut against a bottom face surface of the substrate when said first pin member is configured in the memory configuration and the electronic circuit component is seated upon the seating surface, thereby to prevent removal of the electronic circuit component out of the seating surface.

10. In the electronic circuit component of claim 9, when the electronic component is seated upon the seating surface, said first pin member extends through the first through hole when said first pin member is configured in the first configuration, said first pin member of diametrical dimensions preventing translation of said first pin member out of the first through hole subsequent to positioning of the electronic circuit component upon the seating surface and configuring said first pin member into the memory configuration.

* * * * *